(12) United States Patent
Sood

(10) Patent No.: US 7,372,296 B2
(45) Date of Patent: May 13, 2008

(54) CONFIGURABLE LOGIC DEVICE PROVIDING ENHANCED FLEXIBILITY, SCALABILITY AND PROVIDING AREA EFFICIENT IMPLEMENTATION OF ARITHMETIC OPERATION ON N-BIT VARIABLES

(75) Inventor: Vivek Kumar Sood, Uttar Pradesh (IN)

(73) Assignee: Sicronic Remote KG, LLC, Wilmington, DE (US)

( * ) Notice: Subject to any disclaimer, the term of this patent is extended or adjusted under 35 U.S.C. 154(b) by 253 days.

(21) Appl. No.: 11/263,386

(22) Filed: Oct. 31, 2005

(65) Prior Publication Data
US 2006/0091903 A1 May 4, 2006

(30) Foreign Application Priority Data
Oct. 29, 2004 (IN) .................... 2154/DEL/2004

(51) Int. Cl.
*H03K 19/173* (2006.01)
(52) U.S. Cl. .......................................... 326/38; 326/52
(58) Field of Classification Search ............ 326/37–41, 326/52–55
See application file for complete search history.

(56) References Cited

U.S. PATENT DOCUMENTS

| | | | |
|---|---|---|---|
| 7,167,021 B1 * | 1/2007 | Lewis | 326/37 |
| 7,167,022 B1 * | 1/2007 | Schleicher et al. | 326/41 |
| 7,185,035 B1 * | 2/2007 | Lewis et al. | 708/235 |

* cited by examiner

Primary Examiner—Don Le

(57) ABSTRACT

The configurable logic device provides enhanced flexibility, scalability and area efficient implementation of arithmetic operation on (N–1) bit variables. The device includes a first configurable logic subsystem capable of generating logic OR output in response to functions of N–1 input variables in arithmetic mode, a second configurable logic subsystem capable of generating logic AND output in response to functions of N–1 input variables in arithmetic mode, and a configurable logic block connected at its first input to the output of the first configurable logic subsystem, connected at its second input to the output of the second configurable logic subsystem, connected at its third input to the Nth input variable, and connected at its fourth input to a carry/borrow signal. The configurable logic block provides a first output corresponding to carry/borrow value in arithmetic mode, a second output corresponding to logical functions of the N input variables in the logical mode and a third output corresponding to sum/difference value in arithmetic mode.

12 Claims, 17 Drawing Sheets

CONFIGURABLE LOGIC DEVICE PROVIDING ENHANCED FLEXIBILITY, SCALABILITY AND PROVIDING AREA EFFICIENT IMPLEMENTATION OF ARITHMETIC OPERATION ON N-BIT VARIABLES

FIELD OF THE INVENTION

The present invention relates to configurable logic devices, and more particularly, to a flexible, scalable and configurable logic device with area efficient implementation of arithmetic operation on n-bit variables.

BACKGROUND OF THE INVENTION

Conventional adder/subtractor circuits are used in configurable logic devices to perform the most common arithmetic operations. FIG. 1 is a schematic diagram of a conventional carry chain circuit, which receives three input signals A, B, and Cin, where Cin is a carry input signal received from another carry chain multiplexer circuit. Input signals A and B are applied to input terminals of XOR gate 101A. In response, XOR gate 101A provides a carry propagate signal, P.

Carry propagate signal P is applied to an input terminal of XOR gate 102. Carry input signal Cin is applied to the other input terminal of XOR gate 102. In response, XOR gate 102 provides a sum signal S. Table 1 depicts the truth table for the carry chain circuit shown in FIG. 1.

TABLE 1

| A | B | Cin | P | Sum | Cout |
|---|---|-----|---|-----|------|
| 0 | 0 | 0   | 0 | 0   | 0    |
| 1 | 0 | 0   | 1 | 1   | 0    |
| 0 | 1 | 0   | 1 | 1   | 0    |
| 1 | 1 | 0   | 0 | 0   | 1    |
| 0 | 0 | 1   | 0 | 1   | 0    |
| 1 | 0 | 1   | 1 | 0   | 1    |
| 0 | 1 | 1   | 1 | 0   | 1    |
| 1 | 1 | 1   | 0 | 1   | 1    |

FIG. 2 depicts the subtraction operation A-B by using a conventional logic device. The carry propagate signal P is also applied to a control input terminal of multiplexer 103. Input signal A is applied to the "0" input terminal of multiplexer 103 and the carry input signal Cin is provided to the "1" input terminal of multiplexer 103. Depending upon the value of carry propagate signal P, either input signal A or carry input signal Cin is transmitted through multiplexer 103 as carry output signal Cout. The XNOR gate 101B is used here instead of the XOR gate 101A. This is equivalent to inverting input B and using XOR gate 101A instead.

Implementation of subtraction operation by using two's complement operation is shown in Table 2

TABLE 2

| A | B | Bin | P | Diff(P xor Bin) | Bout |
|---|---|-----|---|-----------------|------|
| 0 | 0 | 0   | 1 | 1               | 0    |
| 1 | 0 | 0   | 0 | 0               | 1    |
| 0 | 1 | 0   | 0 | 0               | 0    |
| 1 | 1 | 0   | 1 | 1               | 0    |
| 0 | 0 | 1   | 1 | 0               | 1    |
| 1 | 0 | 1   | 0 | 1               | 1    |

TABLE 2-continued

| A | B | Bin | P | Diff(P xor Bin) | Bout |
|---|---|-----|---|-----------------|------|
| 0 | 1 | 1   | 0 | 1               | 0    |
| 1 | 1 | 1   | 1 | 0               | 1    |

Carry/Borrow chain circuits shown in FIG. 1 and FIG. 2 have been implemented in a number of different ways in programmable logic devices (PLDs) such as field programmable-gate-arrays-(FPGAs).

A conventional circuit for using a function generator of a programmable logic device to implement carry logic functions is described by the U.S. Pat. No. 5,818,255 that shows one of the methods of implementing the aforementioned truth tables in PLDs. The circuit is further illustrated diagrammatically in FIG. 3. The configurable bits 320 and 401-416 are programmed with appropriate values to implement the truth tables shown in Table 1 and Table 2. Signal G is connected to "A" or "B". It can be easily observed from the aforementioned U.S. Patent that it does not have a dedicated provision to cascade the output S of the 4-input LUT for implementing wide input cascade functions.

Another conventional circuit for implementing dynamic addition subtraction operation is shown in FIG. 4 that perform dynamic addition subtraction in 2's complement form by configuring input G3 or input G4 of the LUT as the add-sub signal and then using some additional logic so that the "cin" may become either "0" for addition or "1" for subtraction, since the operation is 2's complement. It is noteworthy that the add-sub signal needs to be connected at two places that is one at the LUT inputs (G3 or G4) and the other at the logic required for initializing the chain to logic 0 or logic 1. MUXCY is used for implementing carry logic as well as for implementing wide input functions by cascading the outputs of the 4-input LUTs. However the cascade element (MUXCY) does not have any provision of implementing XOR gates. Furthermore, additional connectivity in the logic circuit requires an increase in the resources.

An existing Altera device shown in FIG. 5A provides an XOR gate (501) at the input "data1" of the LUT. This XOR gate is specifically given for performing dynamic addition/subtraction using 2's complement logic. However providing an XOR gate at only one input of the LUT causes the logical equivalence of the two arithmetic inputs "data1" and "data2" to be lost when performing dynamic addition subtraction operation since only "data2±data1" operation can be performed and not "data1±data2" operation. If this equivalence is required then additionally connectivity has to be provided at the input terminals for "data1" and "data2" so that any signal that reaches "data1" can also reach "data2" and vice-versa any signal that reaches "data2" can also reach "data1". This causes an additional increase in hardware resources due to more connectivity and therefore requires more configuration bits.

Table 3 shows the truth table for the subtraction operation for performing A-B in 2's complement form.

TABLE 3

| A | B | Bin(2scomp) | D | Bout(2scomp) |
|---|---|-------------|---|--------------|
| 0 | 0 | 0           | 1 | 0            |
| 1 | 0 | 0           | 0 | 1            |
| 0 | 1 | 0           | 0 | 0            |

TABLE 3-continued

| A | B | Bin(2scomp) | D | Bout(2scomp) |
|---|---|---|---|---|
| 1 | 1 | 0 | 1 | 0 |
| 0 | 0 | 1 | 0 | 1 |
| 1 | 0 | 1 | 1 | 1 |
| 0 | 1 | 1 | 1 | 0 |
| 1 | 1 | 1 | 0 | 1 |

The Bin(2scomp) represents the Bout(2scomp) of the previous subtraction operation. At the start of the subtraction operation Bin(2scomp) is given a fixed value of logic 1 at-the-LSB.

Equation for a 2s complement subtraction(A-B) operation can be written as:

$$\text{Diff}=\sim B\char`\^A\char`\^Bin(2scomp) \qquad (1)$$

$$Bout(2scomp)=(\sim B\&\&A)\|(\sim B\&\&Bin(2scomp))\|(Bin(2scomp)\&\&A) \qquad (2).$$

Here, it is assumed that the operation (101011-110100) that is equivalent to −21-(−12) has to be performed using 2's complement operation, which is illustrated in detail by FIG. 5B. Also shown are the borrow outs of each stage. The result is 110111, which is the binary representation of −9 in 2's complement form. As can be seen from this example that at the LSB "Bin (2scomp)" requires a value of logic 1. This is shown as "init" in FIG. 5B.

All of the above prior art approaches implement subtraction using the two's complement arithmetic. The subtraction is performed by simply inverting one of the operands and making "Cin" as logic 1 for the LSB subtraction. Using two's complement arithmetic it suffices to provide just an adder circuit and generates the requirement of more hardware resources.

Thus, there is a need for an improved logic device that provides a scalable approach for achieving a minimum hardware implementation of arithmetic operations on n-bit variables.

SUMMARY OF THE INVENTION

In view of the foregoing background, it is therefore an object of the present invention to provide a configurable logic device for performing direct subtraction operation on a given set of input variables. It is another object of the present invention to provide a configurable logic device for performing a logical operation on a given set of input variables.

It is further an object of the present invention to provide a cascade configurable logic device for performing an arithmetic operation on data streams comprising at least two bit data.

To achieve the aforementioned objectives the present invention provides enhanced flexibility, scalability and provides area efficient implementation of arithmetic operation on n-bit variables. The configurable logic device comprises a first configurable logic subsystem capable of generating logic OR output in response to functions of N−1 input variables in arithmetic mode, a second configurable logic subsystem capable of generating logic AND output in response to functions of N−1 input variables in arithmetic mode, and a configurable logic block connected at its first input to the output of the first configurable logic subsystem, connected at its second input to the output of the second configurable logic subsystem, connected at its third input to the Nth input variable, and connected at its fourth input to a carry/borrow signal. The configurable logic block provides a first output corresponding to carry/borrow value in arithmetic mode, a second output corresponding to logical functions of the N input variables in the logical mode and a third output corresponding to sum/difference value in the arithmetic mode.

DETAILED DESCRIPTION OF THE PREFERRED EMBODIMENTS

The present invention is discussed in the light of the derivation of the direct method of subtraction. The logical truth table for the method can be clearly seen from Table 4.

TABLE 4

| A | B | Bin(direct) | Diff | Bout(direct) |
|---|---|---|---|---|
| 0 | 0 | 0 | 0 | 0 |
| 1 | 0 | 0 | 1 | 0 |
| 0 | 1 | 0 | 1 | 1 |
| 1 | 1 | 0 | 0 | 0 |
| 0 | 0 | 1 | 1 | 1 |
| 1 | 0 | 1 | 0 | 0 |
| 0 | 1 | 1 | 0 | 1 |
| 1 | 1 | 1 | 1 | 1 |

The equations for this operation are as follows:

$$Diff = A \wedge B \wedge Bin(direct) \qquad (3)$$

$$Bout(direct) = (\sim A \&\& B) \| (B \&\& Bin(direct)) \| (\sim A \&\& Bin(direct)) \qquad (4)$$

The advantage of implementing this equation is that it requires a value of logic 0 for initialization at the start of the chain at the LSB subtraction. This requirement is the same as the requirement for carry chain initialization when performing addition operation, which also requires a fixed value of logic 0 at the start of the chain.

Figure 1:
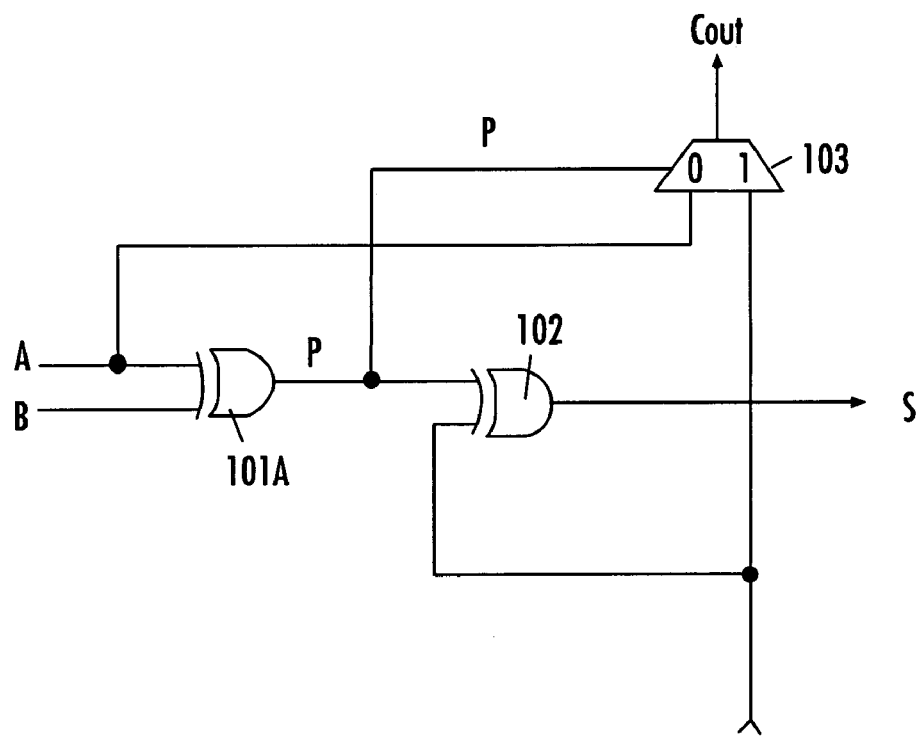
FIG. 1 is a schematic diagram illustrating a conventional carry chain circuit.
Figure 2:
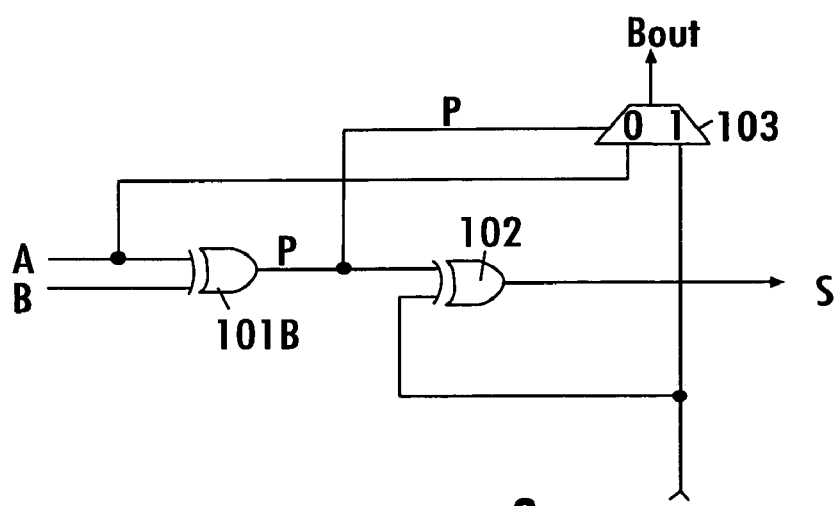
FIG. 2 is a schematic diagram illustrating a conventional logic device for performing subtraction operation.
Figure 3:
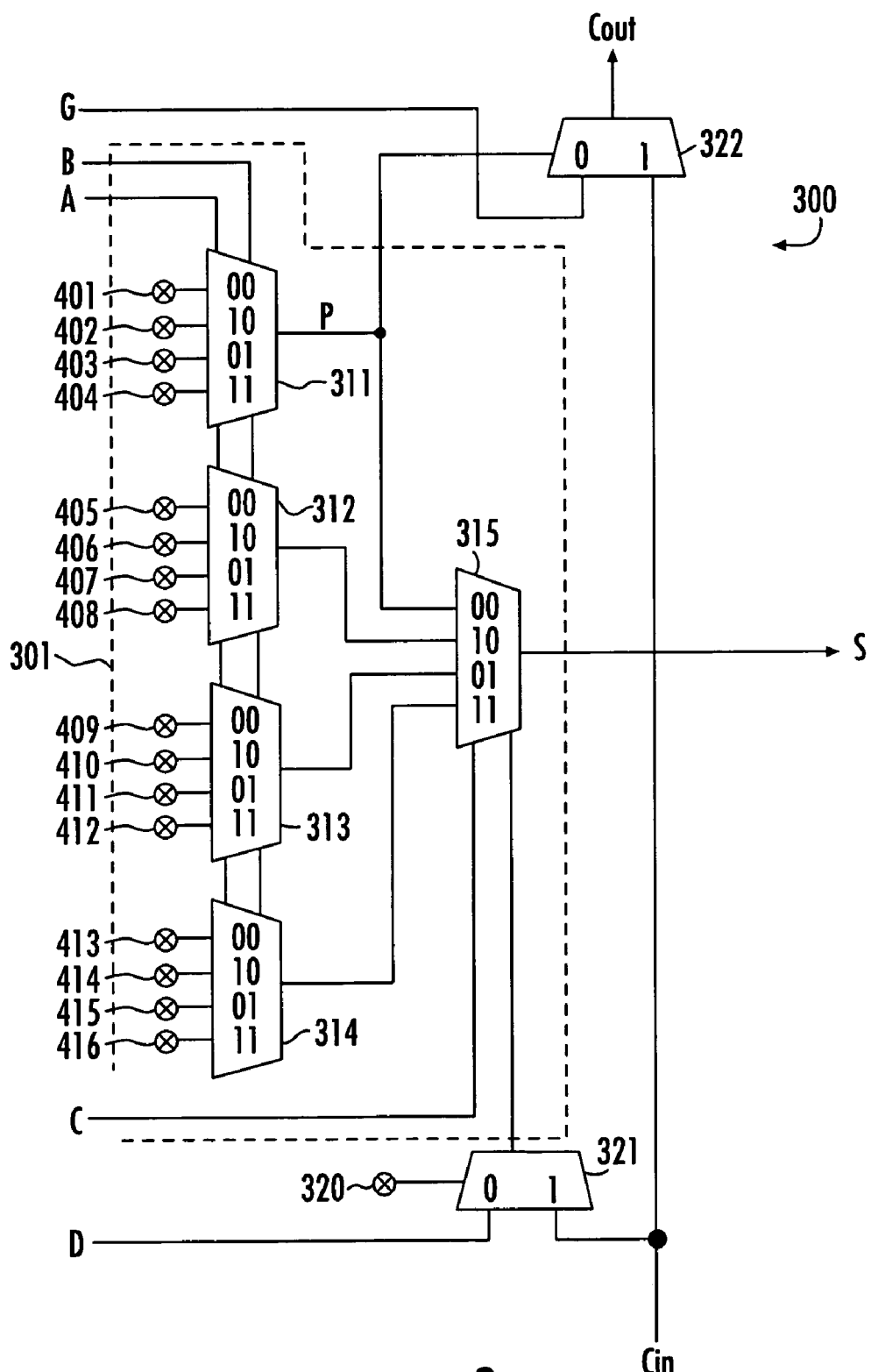
FIG. 3 is a schematic diagram illustrating a conventional programmable logic device for implementing carry logic functions.
Figure 4:
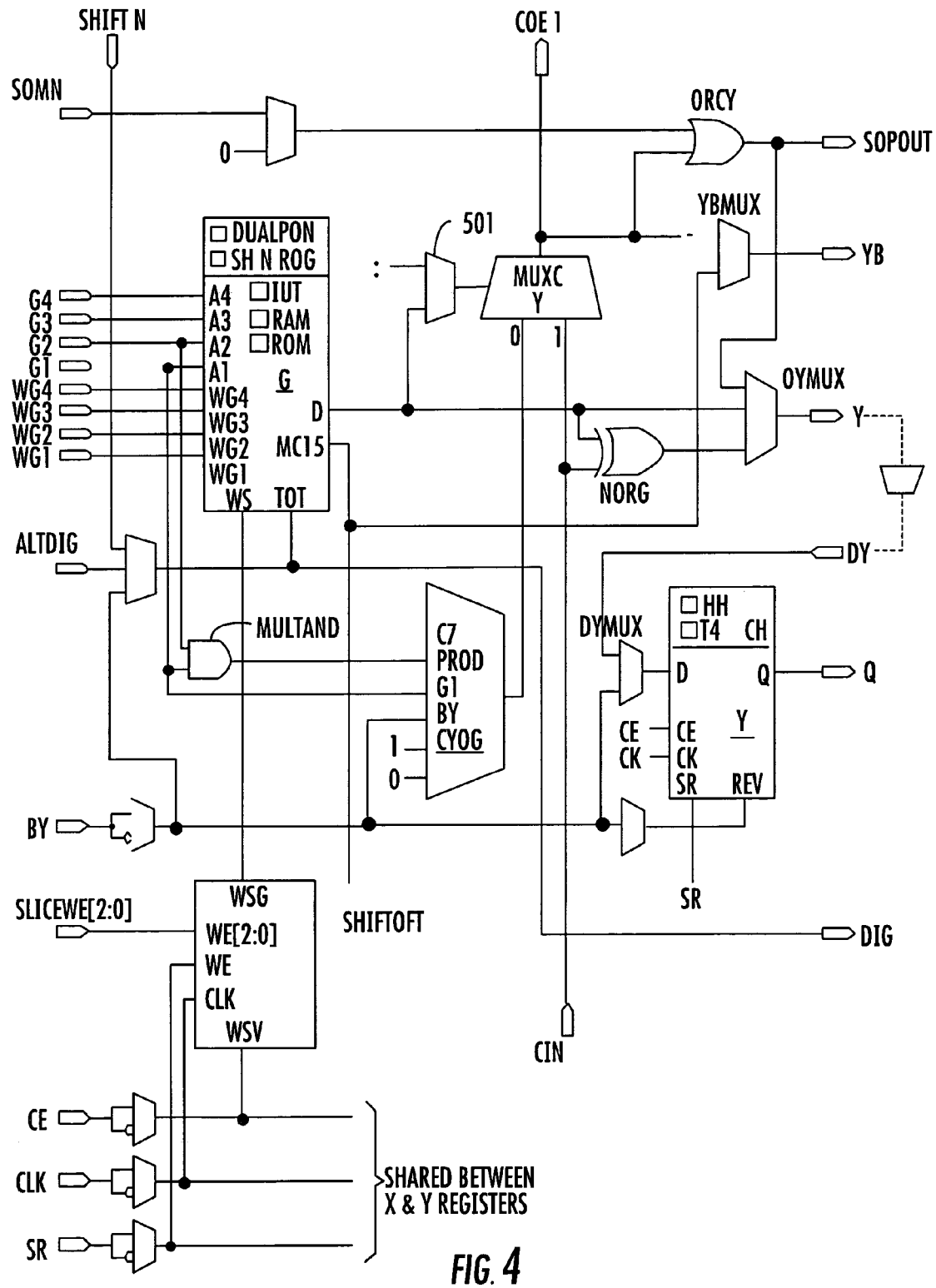
FIG. 4 is a schematic diagram illustrating an existing circuit for performing subtraction using two's complement arithmetic.

It can be therefore seen that implementing this equation in FPGAs will result in a significant saving in area since the requirement of having a value of logic 0 for the carry/borrow initialization will remove the requirement for having a programmable configuration bit at that place programming of which allowed logic 0 or logic 1 values to pass through while performing two's complement addition and subtraction respectively. In FPGAs the configuration bits have a significant area. Doing away with one configuration bit will save a significant area. Moreover, when performing dynamic addition and subtraction operation the add-sub signal need not control the LSB "Bin". This means that the add-sub signal need not have any additional connectivity apart from being connected to the LUT inputs and can be treated just like any other LUT input. This is in contrast to FIG. 4 where the add-sub signal needs to be routed to other logic also; apart from the LUT that implements the addition or subtraction.

Direct method of operation is normally used when dealing with unsigned numbers. However with a slight interpretation of results the direct method of subtraction can also tackle numbers represented in two's complement form. Further, it is shown that how the direct subtraction produces the same result as a two's complement subtraction.

Examining Table 3 and Table 4 it is seen that if Bin (direct) is chosen such that Bin (direct)=~Bin (2scomp) for some given values of operands A and B then for the same values of operands A and B it is found that Bout (direct) =~Bout (2scomp).

Figure 5A:
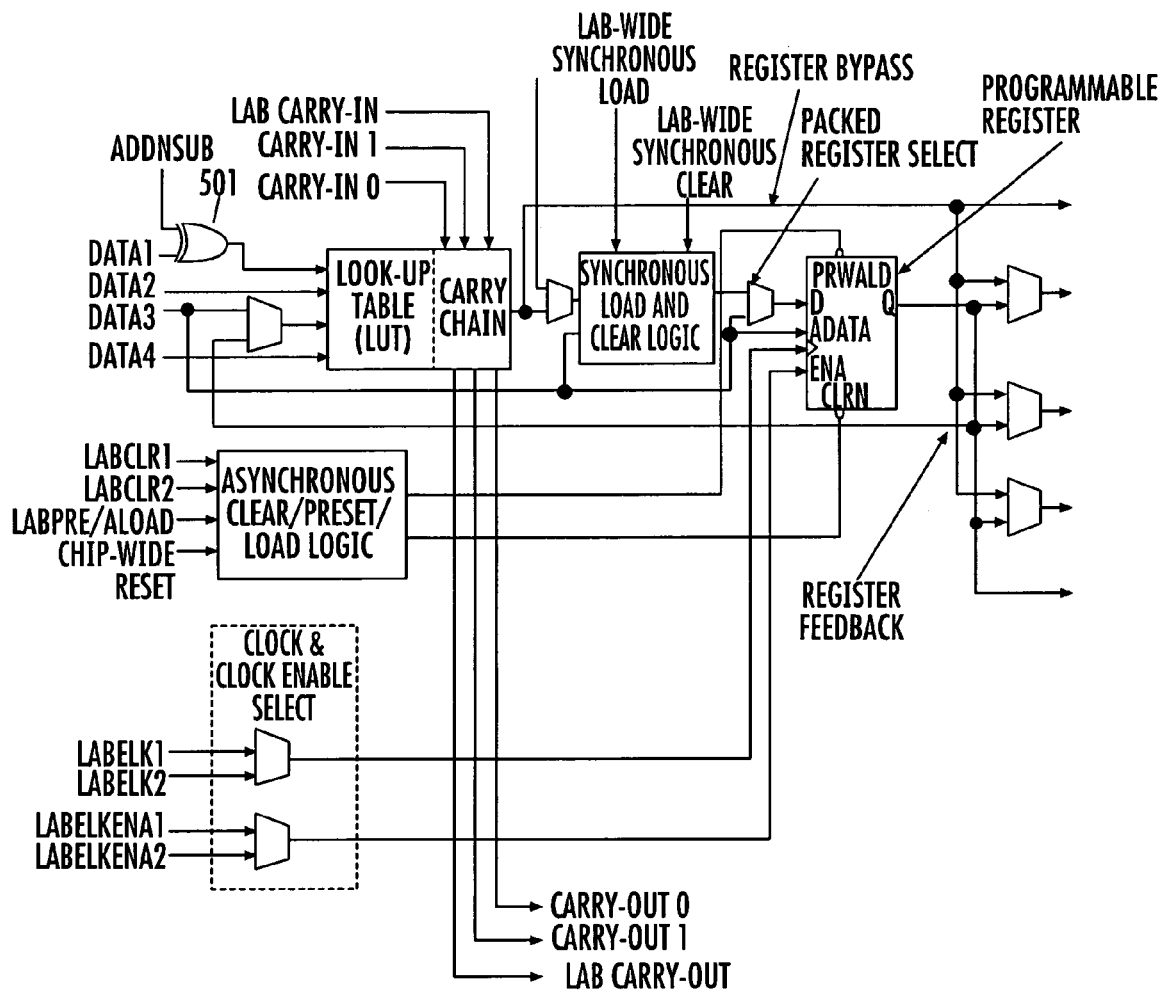
FIG. 5A is a schematic diagram illustrating a conventional device for performing dynamic addition and subtraction on a given set of input data.
Figure 5B:
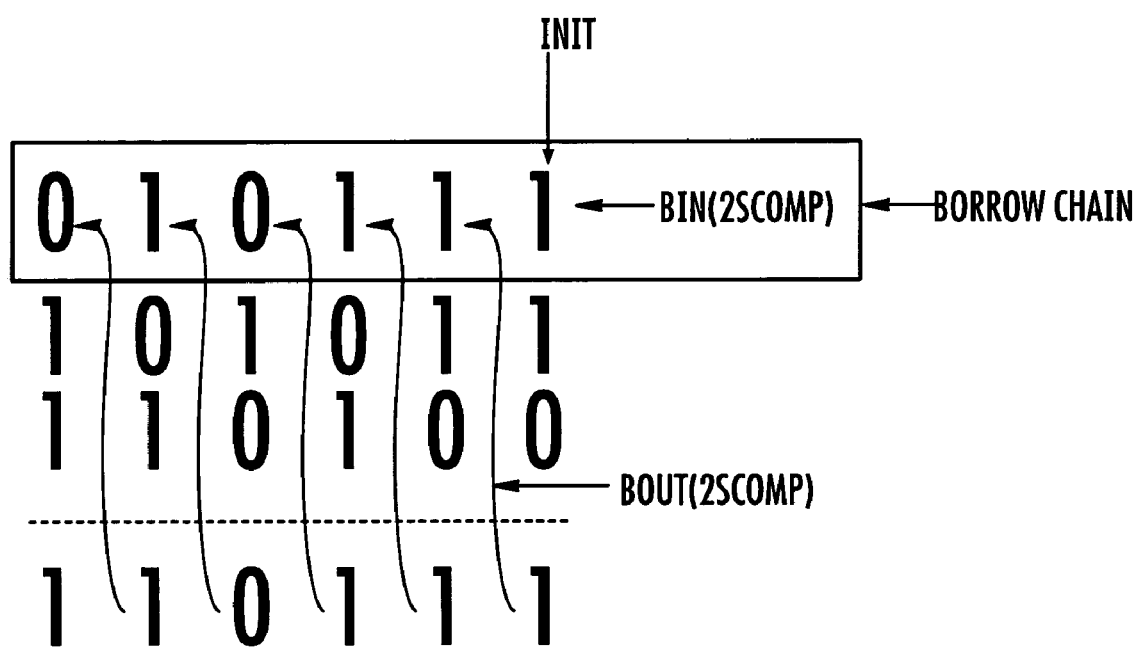
FIG. 5B is a schematic diagram illustrating a conventional bit-by-bit subtraction by using two's complement subtraction.
Figure 6:
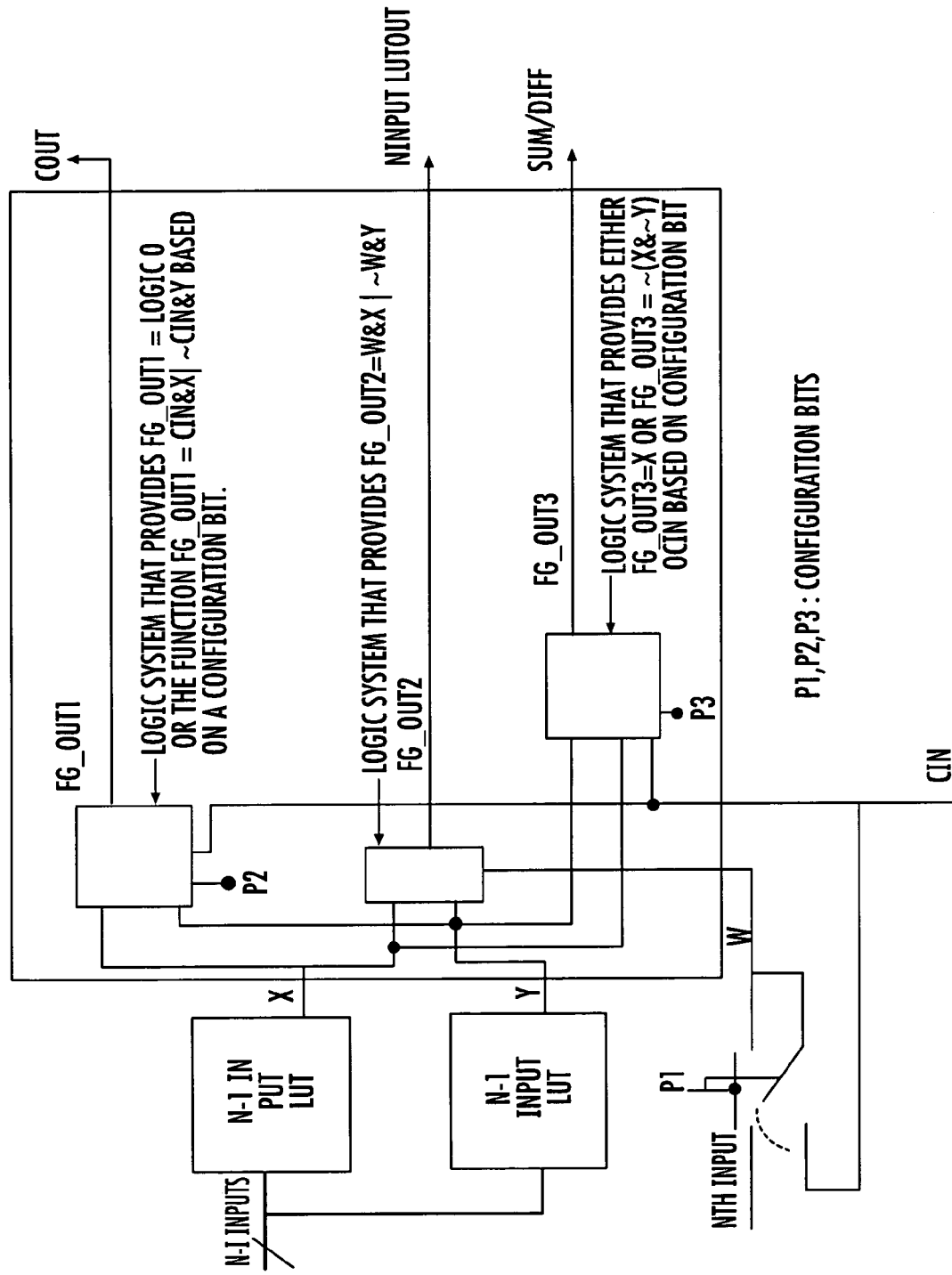
FIG. 6 is a schematic diagram illustrating the configurable logic device in accordance with the present invention.

For discussion, it is assumed that the operation (101011-110100) that is equivalent to −21-(−12) has to be performed using 2's complement operation, which is illustrated in detail by FIG. 6. Also shown are the borrow outs of each stage. The result is 110111, which is the binary representation of −9 in 2's complement form. As can be seen from this example that at the LSB "Bin (2scomp)" requires a value of logic 1. This is shown as "init" in FIG. 5B.

FIG. 6 illustrates the schematic of the configurable logic device for implementing the arithmetic, logic operations for an input for n-bit variables. It is seen that the LUTs are coupled to N−1 input data streams for generating an intermediate arithmetic and logic function of said N−1 input data stream. The outputs X and Y from the LUTs are further provided to a logic selector for generating a logical function FG_OUT2 of the N−1 input variables and to two logically configurable subsystems for generating sum/difference and carry/borrow signals. The logically configurable subsystems are driven by the configuration bits P2 and P3 and are connected to a carry/borrow input signal CIN besides being connected to each other for producing carry/borrow FG_OUT 1 and sum/difference FG_OUT 3 outputs respectively. The switching logic P1 is a two-way switch that is connected to a configuration bit P1 and its inversion signal at its first input, coupled to Nth input at its second input and coupled to the carry/borrow input signal CIN at its third input to generate an output W that is further connected at the select input of the logic selector for generating said logical function of N−1 input variables. Switch P1 is used for enabling the carry/borrow input logic to perform arithmetic operation on data streams comprising at least two bits.

Figure 7:
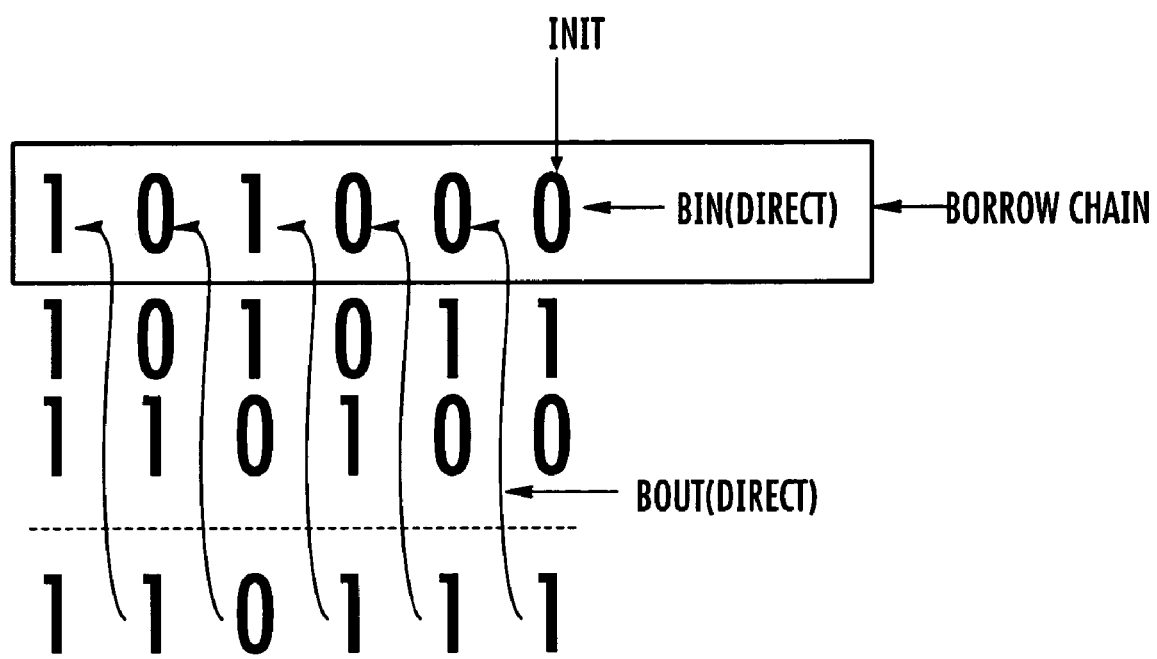
FIG. 7 is a schematic diagram illustrating the bit-by-bit subtraction by using direct subtraction in accordance with the present invention.

It is now considered whether the same operands (101011 and 110100) are given to a direct method subtractor and the same subtraction has to be done using the direct method. FIG. 7 shows this operation. As can be seen from this example that at the LSB "Bin(direct)" requires a value of logic 0 for initialization. This is shown as "init" in FIG. 7. This logic 0 value is the same as that required for carry chain initialization in case of binary addition, as can be verified by those skilled in the art.

From the example shown in FIGS. 5B & 7 it can be seen that at each stage Bout (direct)=~Bout (2scomp). The value of "Diff" remains the same in the two cases. Thus using the direct method of subtraction we can deal with numbers represented in 2's complement as well, the only difference being that Bout (2scomp)=~Bout (direct). This however is not a problem in FPGAs since the inverter can easily be absorbed in the LUT if intermediate borrow outs are required to be used at places other than the borrow chain.

The present invention therefore implements the addition and subtraction using the above concept such that no additional configuration bits differentiate the addition operation from the subtraction operation, apart from the configuration bits of the look up table. An object of the present invention is to therefore provide an efficient method of implementing arithmetic operations (addition, subtraction and dynamic addition/subtraction) and to provide efficient means of implementing all wide input cascade functions.

The invention therefore provides means to implement addition/subtraction as well as dynamic addition/subtraction. The carry chain can also be used for the implementation of wide input functions. The invention includes the 4-input LUT (818) formed using four 2-input LUTs (801), (802), (803) and (804). Outputs of the multiplexers Mux (805) and Mux (806) act as the outputs of the two 3-input LUTs (816) and (817) respectively. Output of Mux (807) as well as Mux (809) generate the output of the 4-input LUT (818). However Mux (807) and (809) are different in the aspect that the Mux (809) takes its input from unit (808), which causes the output of Mux (809) to have a fixed value of logic 0 or the normal 4-input LUT out (composed of inputs I0,I1,I2 and CBin) depending on the configuration bit (P1). Mux (809) belongs to a dedicated chain structure, which does not disturb the normal 4-input LUT out functionality, which is still available at output FG_OUT2. Note that the functionality of Unit (808) is not limited by the implementation shown in FIG. 8. Several possible implementations of Unit (808) are possible. One such can be the usage of two AND gates, the outputs of which act as inputs to "0" and "1" of Mux (809). One of the inputs to each of these AND gates are the outputs of Mux (805) and Mux(806) respectively. The other input to each of these AND gates is the configuration bit (P1). Thus when P1 is "0" the output of Mux(809) is "0" else it as the normal 4-input LUT out (composed of inputs I0, I1, I2 and CBin).

Unit (810) is used to implement the sum/difference out both for adder and subtractor respectively. Note that the functionality of Unit (810) is not limited by the implementation shown in the FIG. 8. Several possible implementations of Unit (810) are possible.

Figure 8:
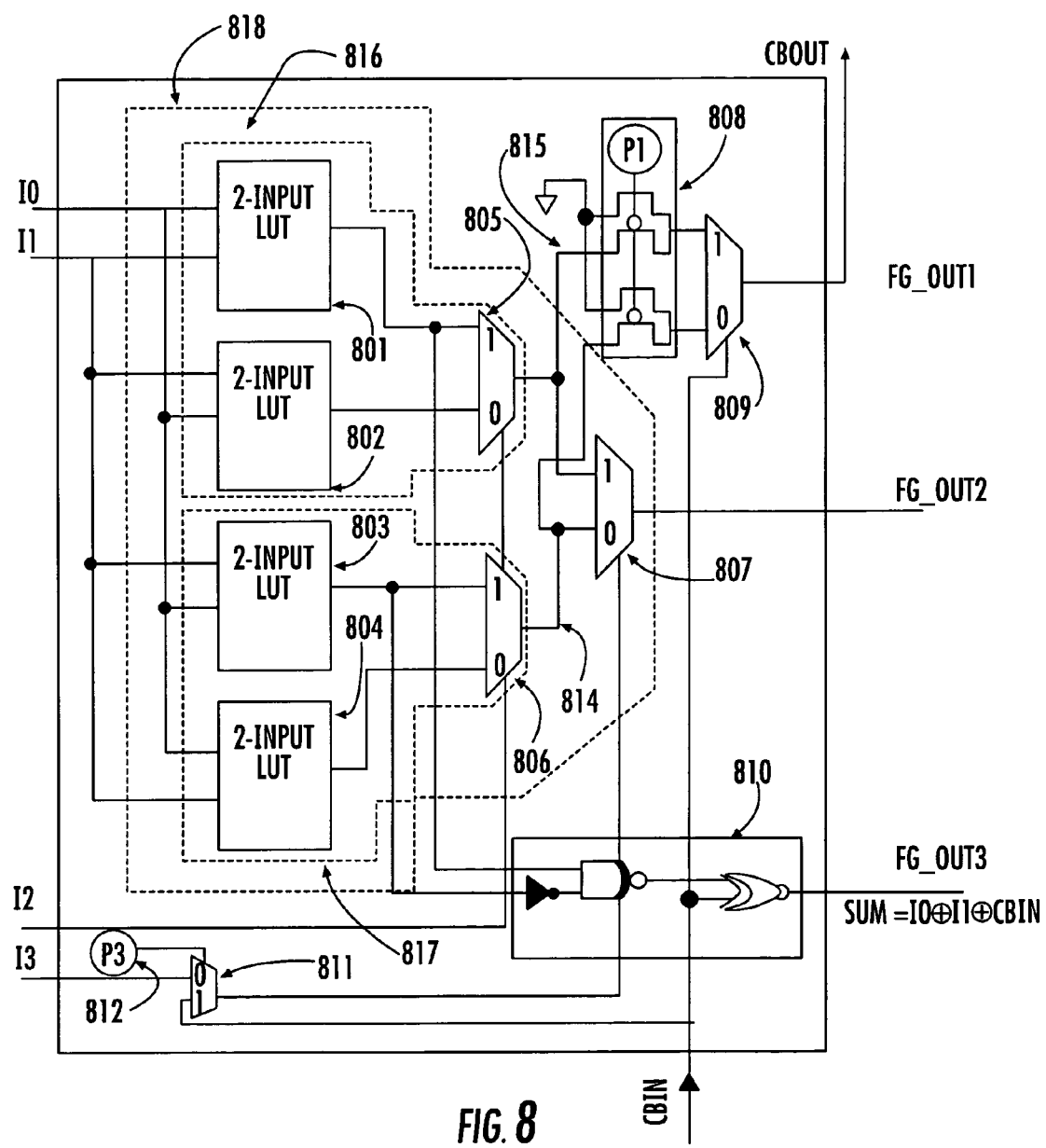
FIG. 8 is a schematic diagram illustrating an embodiment of the configurable logic device of the present invention for implementing arithmetic and logic operations of n-bit input variables.

Signals I0, I1, I2, I3 and CBin are the inputs to the apparatus shown in FIG. 8. The apparatus can be configured in these modes: Arithmetic mode—including addition, subtraction and dynamic addition/subtraction; Normal Mode; and Cascade Mode

| LUT FUNCTIONALITY IN ARITHMETIC MODE |
| --- |
| Functionality to be implemented in 2-LUT1(801) - <br> F = I0 ‖ I1 <br> Functionality to be implemented in 2-LUT2(802): <br> ADDER: <br> F = I0 ‖ I1 <br> SUBTRACTOR/Dynamic ADD-SUB mode: <br> F = ~I0 ‖ I1 for I0 − I1 <br> F = I0 ‖ ~I1 for I1 − I0 <br> Functionality to be implemented in 2-LUT3(803) - <br> F = I0 && I1 <br> Functionality to be implemented in 2-LUT4(804) - <br> ADDDER mode: <br> F = I0 && I1 <br> SUBTRACTOR/Dynamic ADD-SUB mode: <br> F = ~I0 && I1 for I0 − I1 <br> F = I0 && ~I1 for I1 − I0 |

Addition Mode

The sum equation that is implemented is:

$$\text{Sum} = I0 \wedge I1 \wedge \text{CBin}. \quad (5)$$

Carry equation is:

$$\text{Carry\_Out} = [(I0\|I1)\&\&\text{Carry\_in}]\|[I0\&\&I1\&\&\sim\text{Carry\_in}] \quad (6)$$

$$\text{Sum} = I0 \wedge I1 \wedge \text{Carry\_in} = (I0\text{xnor}I1) \text{xnor Carry\_in} \quad (7)$$

$$I0\text{xnor}I1 = [\sim(I0\|I1)]\|[I0\&\&I1] \quad (8)$$

Equation 8 expresses I0 xnor I1 in terms of RHS components of Equation 6. Equation 7, which denotes the SUM can now be expressed in terms of Equation 8. Thus, finally it follows from this that equation 5 can be expressed in terms of components of RHS of equation 6. Hence SUM can be generated from the components of equation 6.

Figure 9:
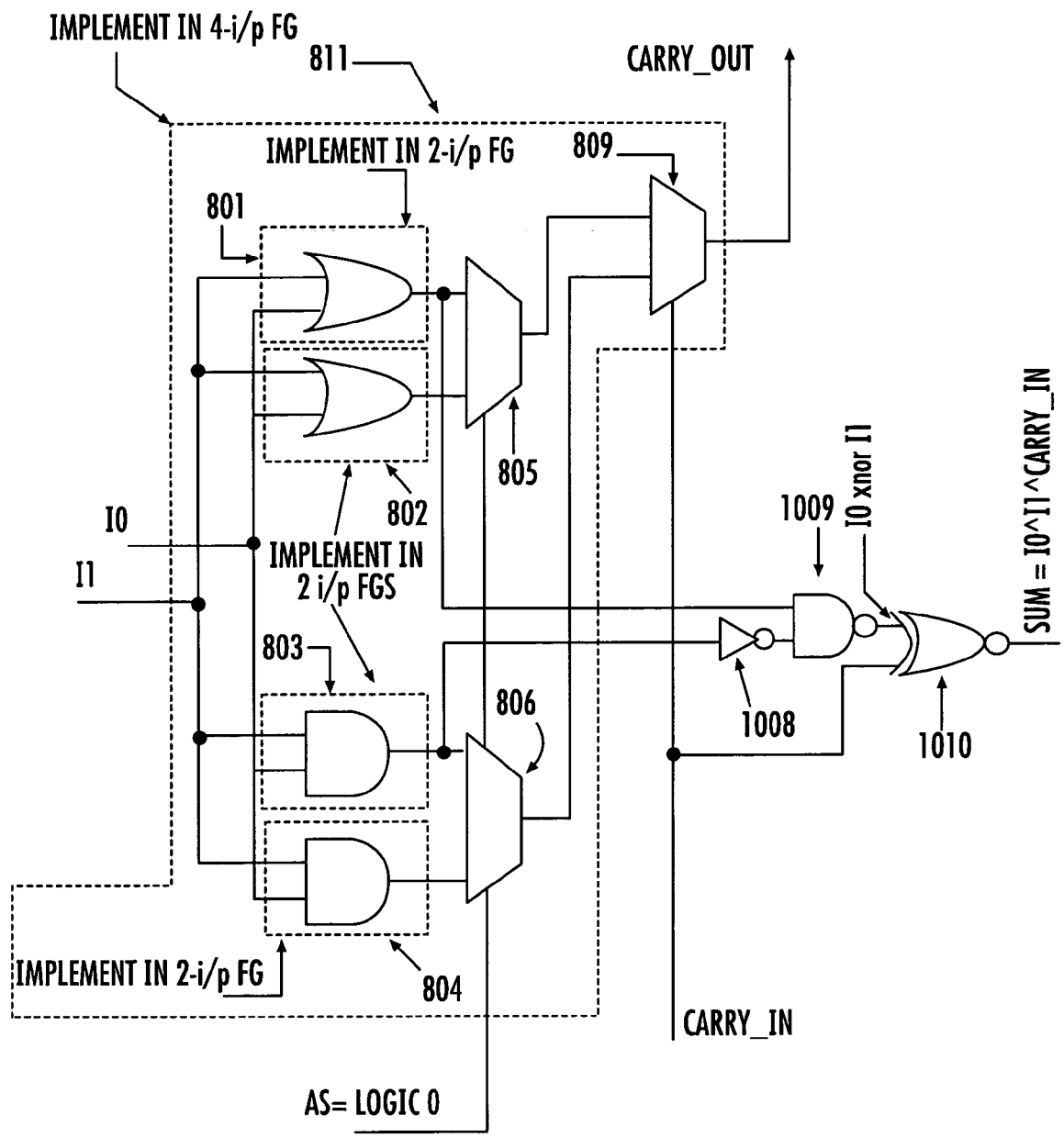
FIG. 9 is a schematic diagram illustrating a first sub-structure of the configurable logic device of FIG. 8 for generating a first arithmetic output in accordance with the present invention.

In this mode of operation the four 2-input LUTs (801), (802), (803) and (804) are configured to implement the functionality shown in FIG. 9 so that "CBout" implements equation 6. The apparatus then performs the addition operation I0+I1 or I1+I0. Input I2 is pulled to logic 0 for this operation. This causes multiplexers (805) and (806) to select the output of the 2-input LUTs (802) and (804) respectively, which thus act as the two inputs of the multiplexer (809). P1 of unit 808 is configured to select the signals (814) and (815) as the inputs to the Multiplexer (809). "CBin" is the select line of multiplexer (809).

The outputs of 2-input LUTs (801) and (803) act as the inputs of unit (810). Functionality implemented in (801) and (803) is as shown below. (801) is configured by the user to implement I0‖I1 and (803) is configured by the user to implement I0 && I1. Both of these are the RHS components of equation 6. Thus the output of unit (810) now implements the sum equation 5 using the logic of equations-(7)-and-(8).

Figure 10:
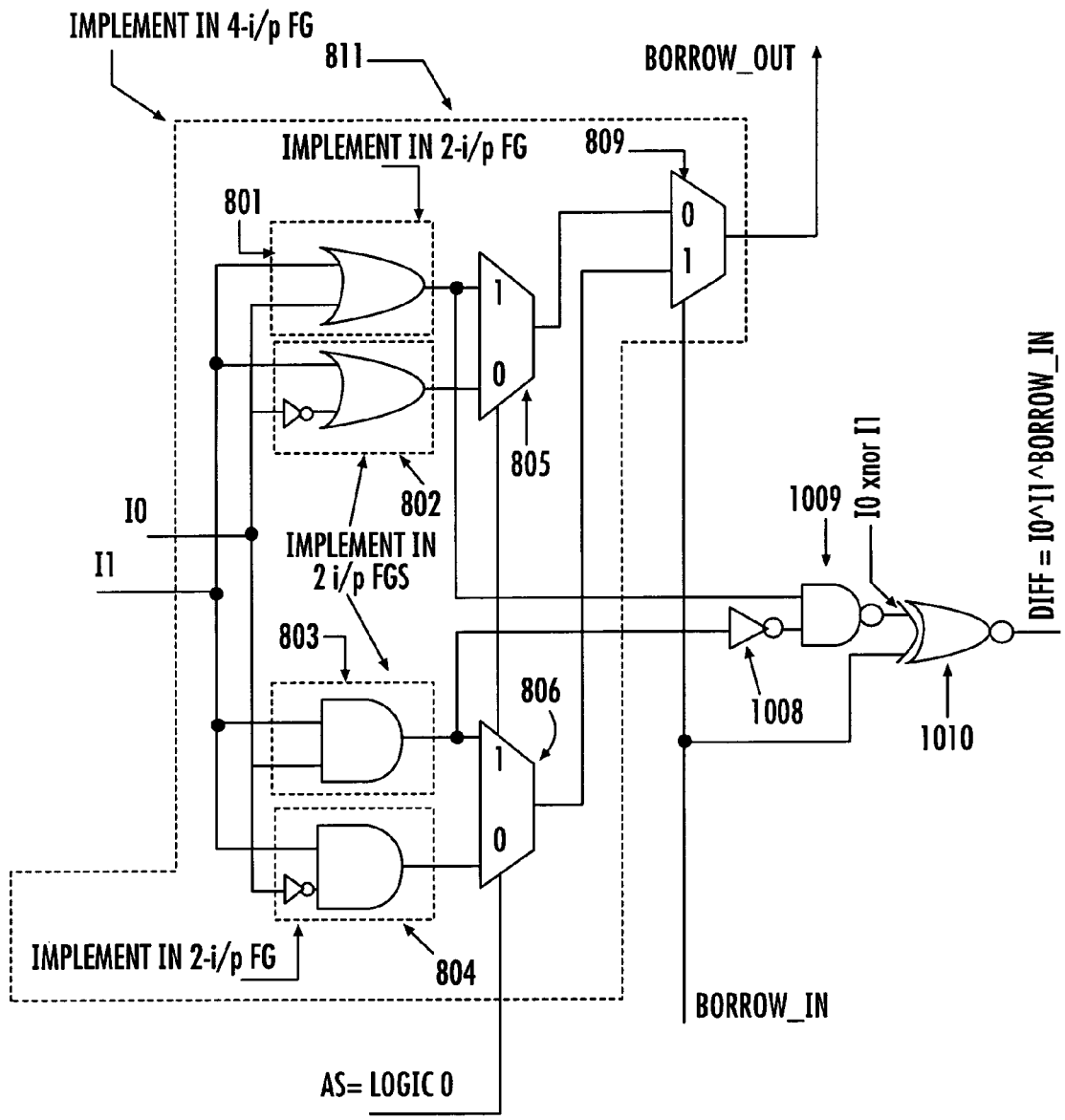
FIG. 10 is a schematic diagram illustrating a second sub-structure of the configurable logic device of FIG. 8 for generating a second arithmetic output in accordance with the present invention.

FIG. 10 shows the functionality of the 2-input function generators (801), (802), (803) and (804) that can be used to implement this equation. Note that these 2-input FGs are actually a part of the 4-input FG (811), which is also shown in FIG. 10. Inverter 1008, NAND gate 1009 and XNOR gate 1010 are the additional components required to implement the SUM logic. Signal AS, as shown in FIG. 10, is pulled down to logic 0 using many of the possible techniques apparent to those skilled in the art.

Subtractor Mode:

Subtraction operation (I0−I1)

Equation of borrow out is:

$$\text{Borrow\_Out} = [(\sim I0\|I1)\&\&\text{borrow\_in}]\|[\sim I0\&\&I1\&\&\sim\text{borrow\_in}] \quad (9)$$

Equation of the difference (DIFF) remains same as equation of SUM, which is again given, by equations 5 and 8 mentioned above.

Figure 11:
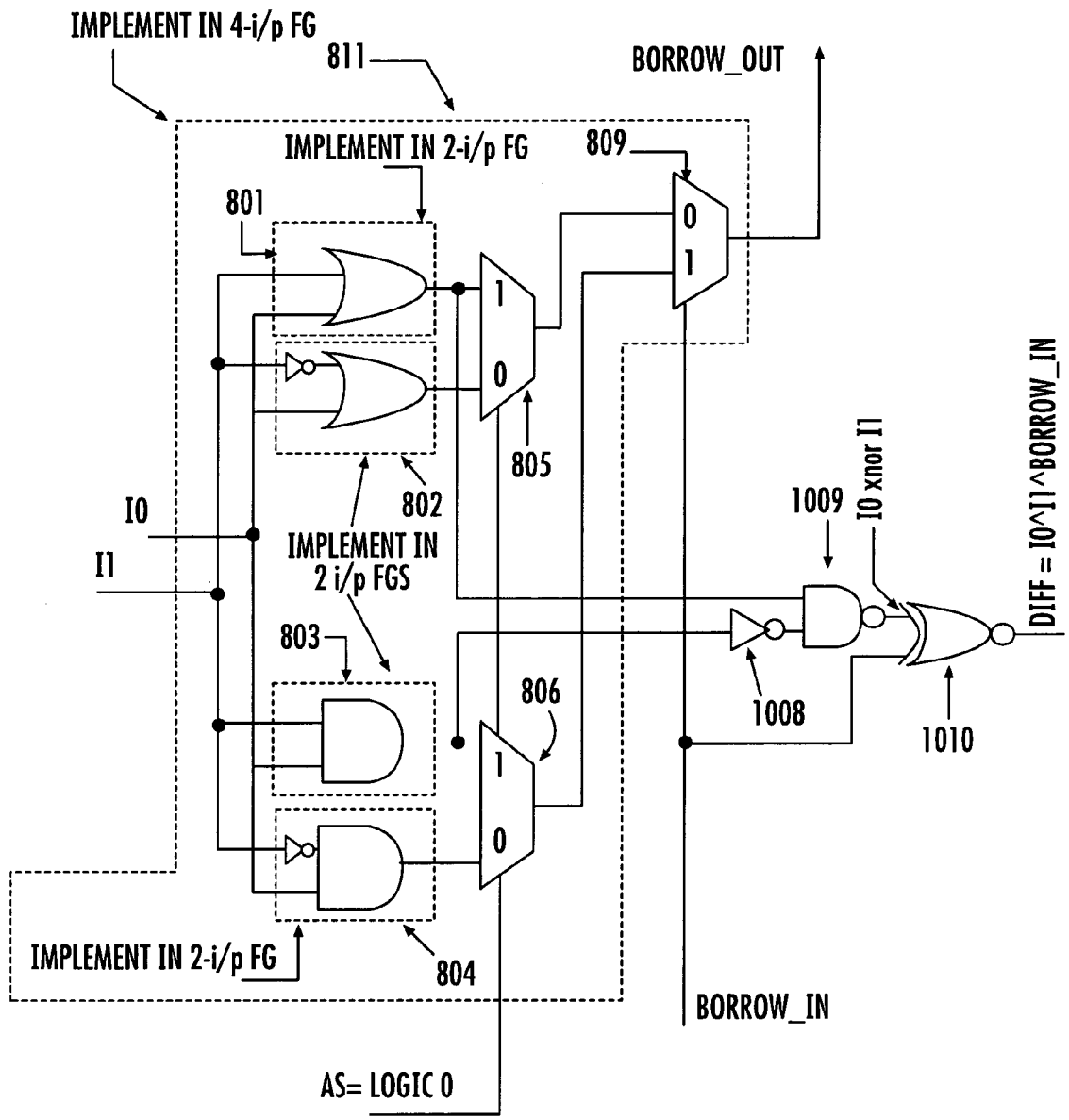
FIG. 11 is a schematic diagram illustrating a third sub-structure of the configurable logic device of FIG. 8 for generating a third arithmetic output in accordance with the present invention.

FIG. 11 shows the functionality of the 2-input LUTs that can be used to implement this equation. The units (801) and (803) have the same functionality as that in the adder mode. However, the functionality of (802) and (804) is different from that in the adder mode. As signal again needs to be pulled to logic 0 similar to the adder mode.

Subtraction Operation (I1−I0)

Equation of borrow out is:

$$\text{Borrow\_Out} = [(\sim I1\|I0)\&\&\text{borrow\_in}]\|[\sim I1\&\&I0] \quad (10)$$

Equation of the difference DIFF remains same as equation of SUM, which is again given, by equations 5 and 8 mentioned before.

Figure 12:
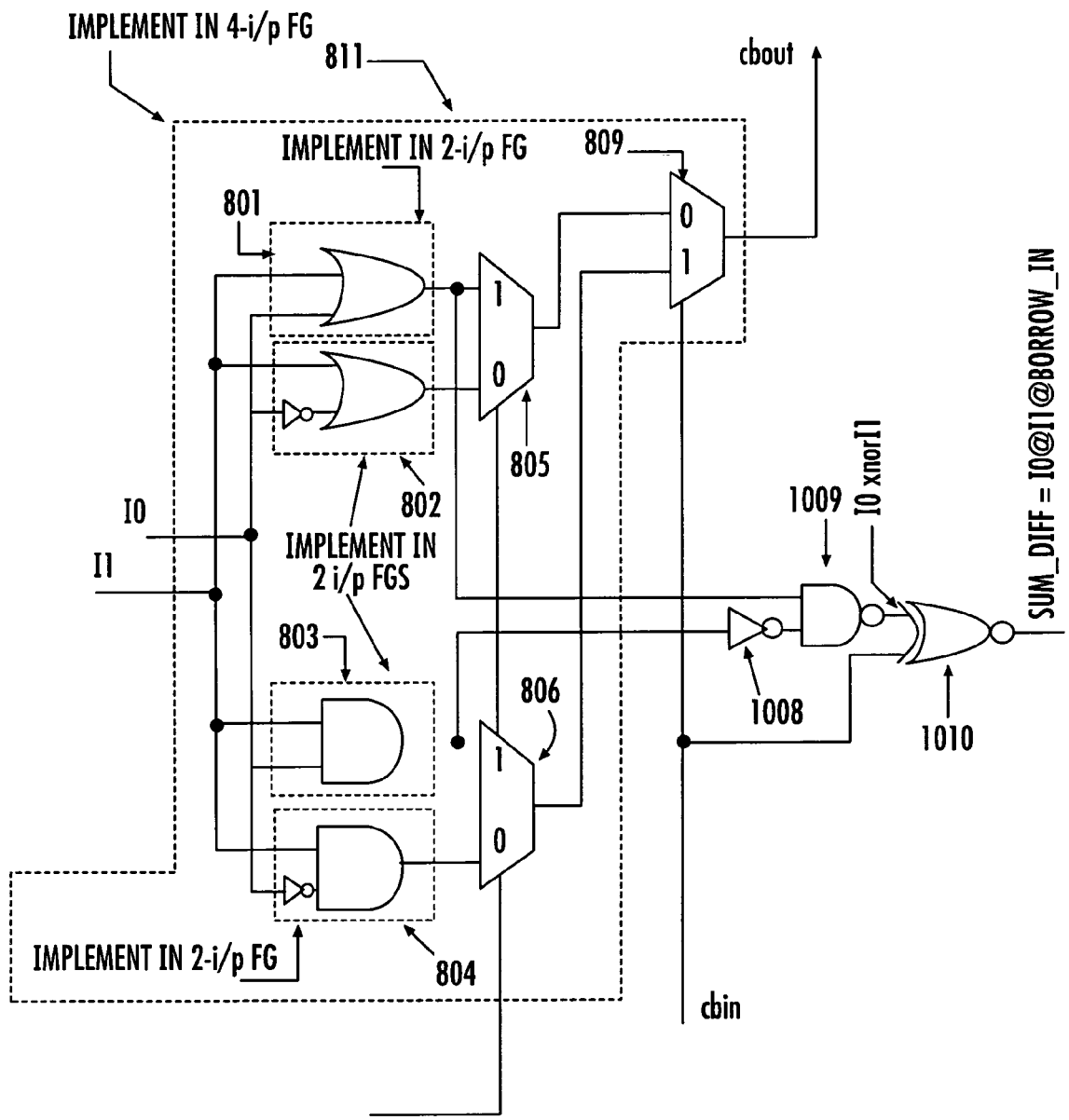
FIG. 12 is a schematic diagram illustrating a fourth sub-structure of the configure logic device of FIG. 8 for generating a fourth arithmetic output in accordance with the present invention.

FIG. 12 shows the functionality of the 2-input LUTs that can be used to implement this equation. The units (801) and (803) have the same functionality as that in the adder mode. The functionality of (802) and (804) is different from that of the subtractor (I0−I1) mode. As signal again needs to be pulled to logic 0 similar to the adder mode.

Figure 13:
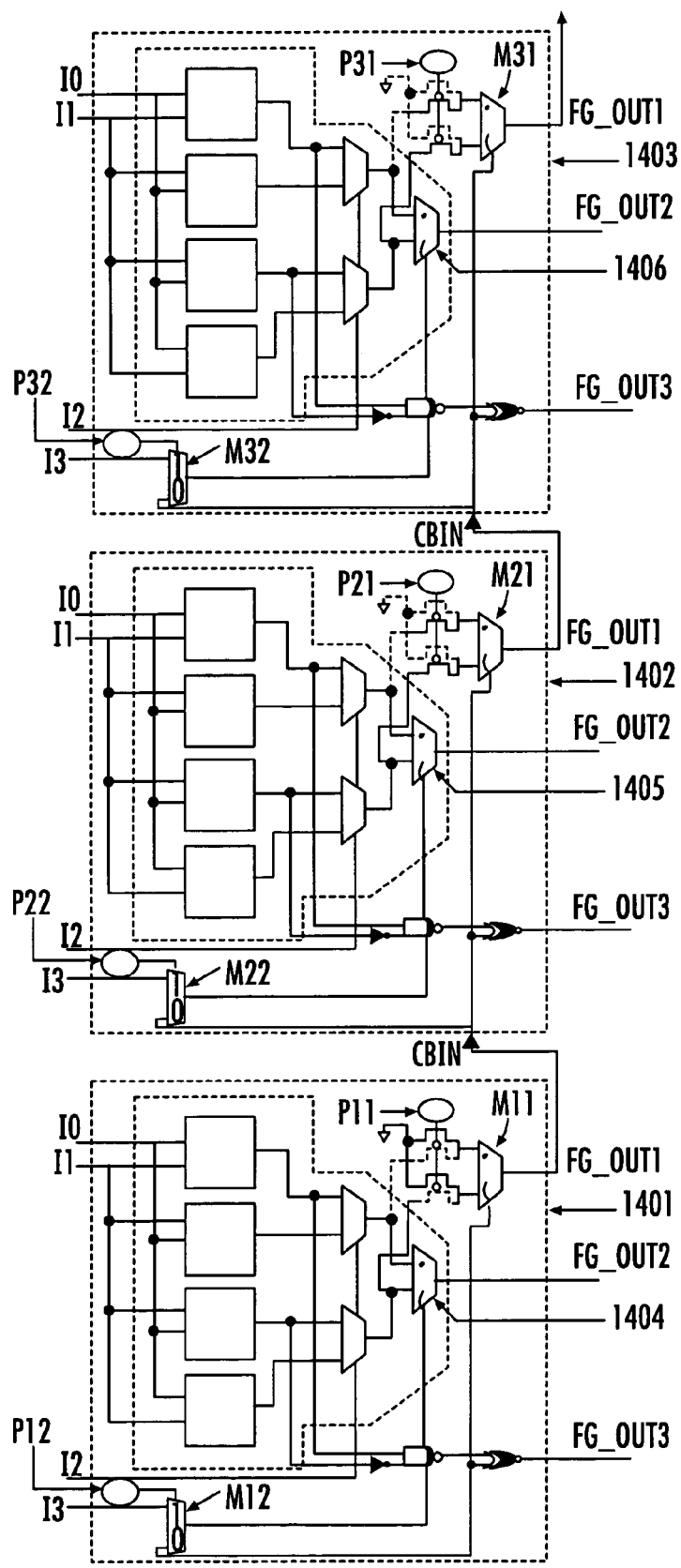
FIG. 13 is a schematic diagram illustrating a cascaded configurable logic device in accordance with the present invention.

Dynamic Addition Subtraction:

This mode has the same implementation as the subtractor modes except that AS becomes a normal input to the apparatus and is controlled by the output of some other circuit rather than being permanently pulled to logic 0. FIG. 13 show the dynamic add-sub mode for performing I0±I1. Note how in this mode the AS signal is not pulled to ground but behaves like any other input to the apparatus and control the operation of addition and subtraction. When AS is logic 0 subtraction is performed and when AS is logic 1 addition is performed.

Similarly dynamic addition/subtraction for performing I1±I0 can be implemented.

Note that in any of the above implementations, apart from the changing configuration bits of the LUT no additional configuration bit is required to differentiate between the addition or the subtraction operation, which means that it requires less configuration bits as compared to few of the Prior art approaches mentioned above apart from other advantages to-be-mentioned-later.

Figure 14:
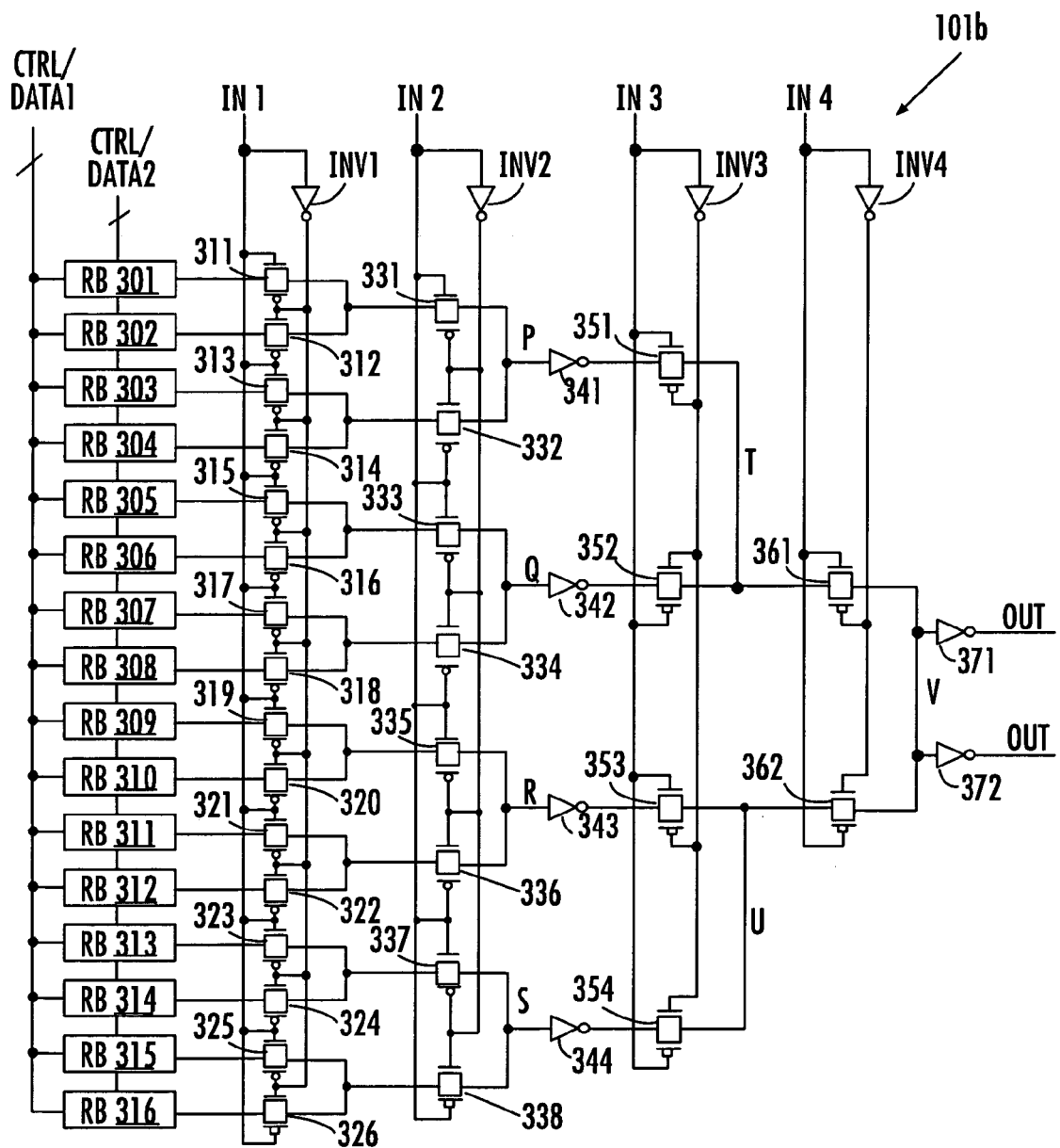
FIG. 14 is a schematic diagram illustrating the internal structure for the cascaded structure of the configurable logic device of FIG. 13 in accordance with the present invention.

Normal-Mode:

In this mode of operation FG_OUT1 generates a fixed value of logic 0 using bit "P1" of FIG. 8 while FG_OUT2 generates the normal 4-input LUT functionality. This logic 0 value can be used for two purposes. Firstly it causes the start of the carry/cascade chain in an apparatus that is above the apparatus that causes this initialization. Secondly it can be used for preventing the unnecessary toggling of the unused portions of the carry/cascade chain. Referring to FIG. 14, (P11) is configured such that Mux (M11) generates a value of logic 0. FG_OUT2 generates any 4-input function of inputs "I0", "I1", "I2" and "I3". Thus, even when initializing, the normal 4-input functionality of (1401) is not disturbed.

Cascade-Mode:

This mode is identical to the arithmetic mode except that now the functionality of the 4-input LUT is not limited by the values mentioned in FIG. 9. The 4-input LUT (818) shown in FIG. 8 generates any four input function of inputs I0, I1, I2 and CBin. This function is obtained at the output FG_OUT1 which is the output of Mux(807) (M21 and M31 in FIG. 14). Referring again to FIG. 14 it is seen that since FG_OUT1 connects to CBin of the apparatus just above it therefore this whole cascaded structure forms a cascade chain that can implement wide functions. If (1402) has to implement the first element of a carry/cascade structure then (1401) is configured in the normal mode. Output of Mux (M11) goes to logic 0. This causes Mux (M21) to select the signal at its "0" input as its output. Thus the output of Mux (M21) can have any function of three inputs I0, I1 and I2; the inputs belonging to structures such as (1402). For the Arithmetic mode this function can be a half adder or half subtractor. For the cascade mode this can be any Boolean function of three variables formed using I0, I1 and I2. Now say one requires the result of the cascade or carry function operation to be propagated to any other place other than the "CBin" of the apparatus belonging to the chain; then the same function as is available at FG_OUT1 can be made available at FG_OUT2. Thus for example FG_OUT1 of (1403) is required to be on some other logic other than the chain, then (P32) is programmed such that the signal at input "0" of Mux (M32) is propagated as the output of (M32). This causes FG_OUT1 and FG_OUT2 of (1403) to have the same functionality. Thus FG_OUT2 of (1403) can be used to tap the intermediate or the end carry/cascade outs.

It can be seen from FIG. 14 that since the output of one 4-input LUT acts as the input of another 4-input LUT (using multiplexers like M11, M21 and M31 in FIG. 14), the output of this 4-input LUT acts as an input of another 4-input LUT(using similar type of muxes) and so on therefore this structure of the cascaded 4-input LUTs can implement wide input functions without any restraint on the functionality to be implemented in the cascade structure.

Figure 15:
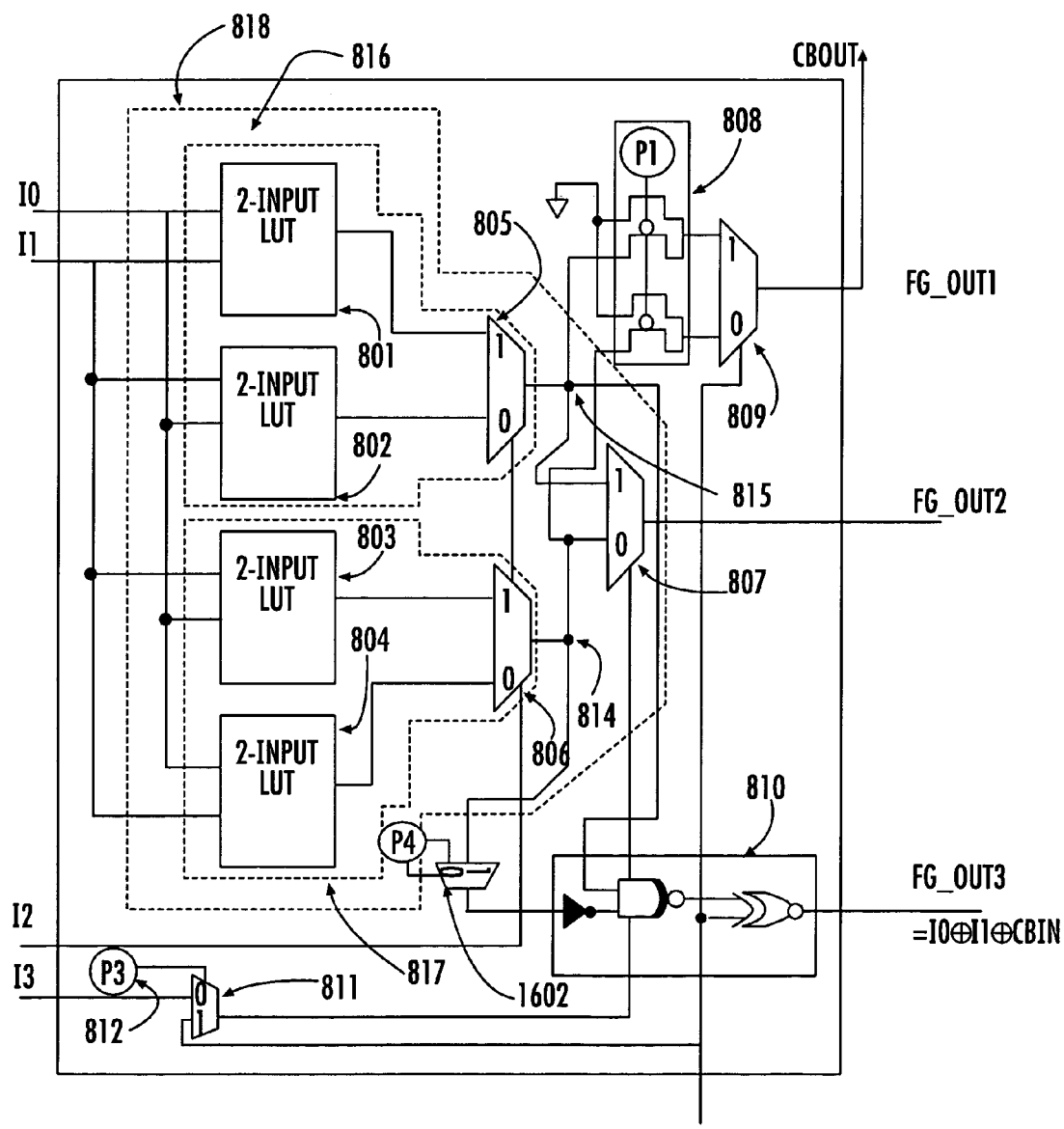
FIGS. 15, 16 & 17 are schematic diagrams illustrating another embodiment of the present invention.
Figure 16:
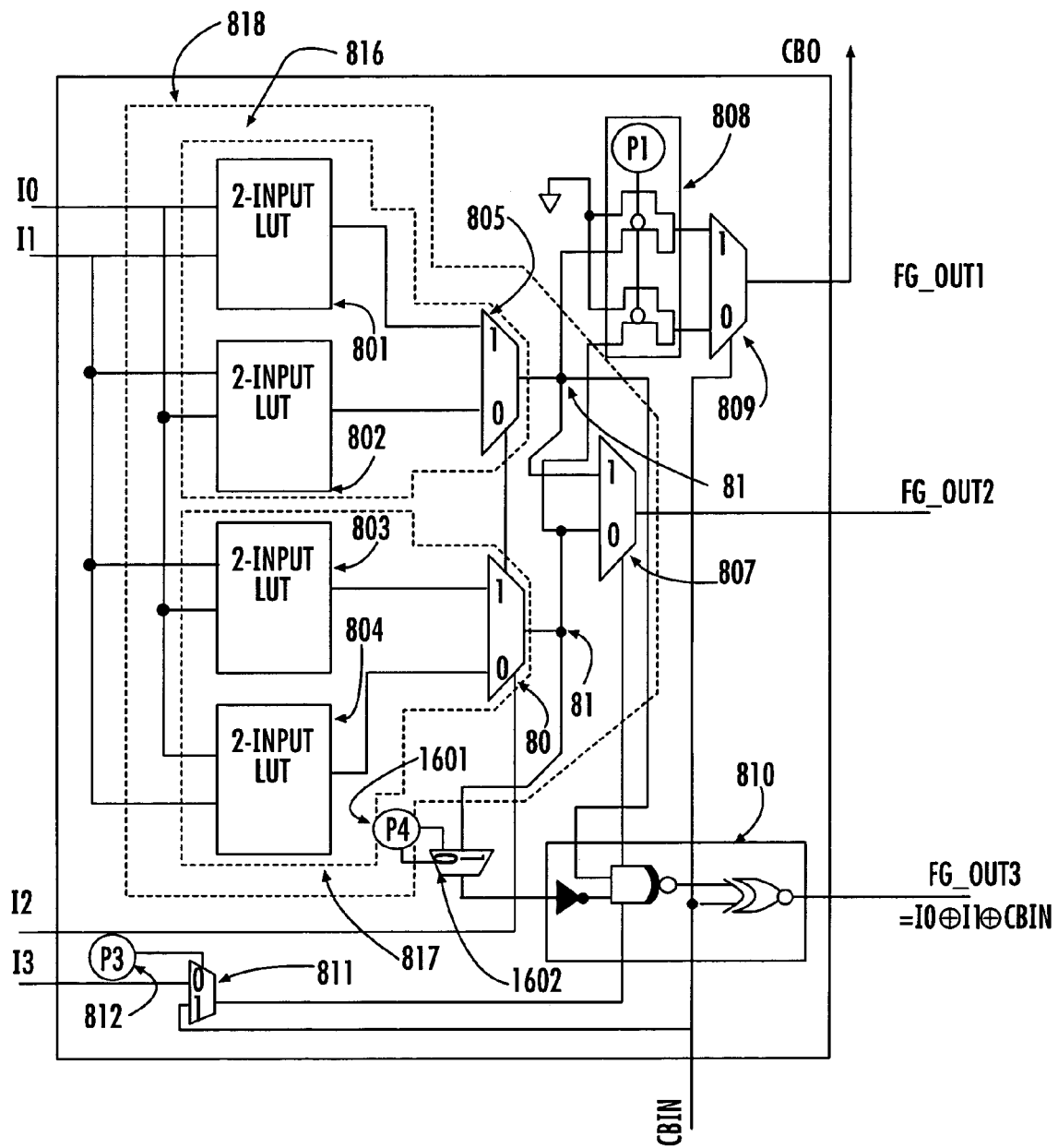

FIGS. 15 and 16 show another embodiment of the invention. Here the inputs to (810) are taken in a different manner. These are taken from points (814) and (815) which are the outputs of muxes (805) and (806) respectively, instead of being taken from the outputs of the 2-input LUTs (801) and (803) which was shown previously in FIG. 8. Mux (1602) is further added as shown in FIG. 16. Following discussion explains how this embodiment functions and its advantages.

Figure 17:
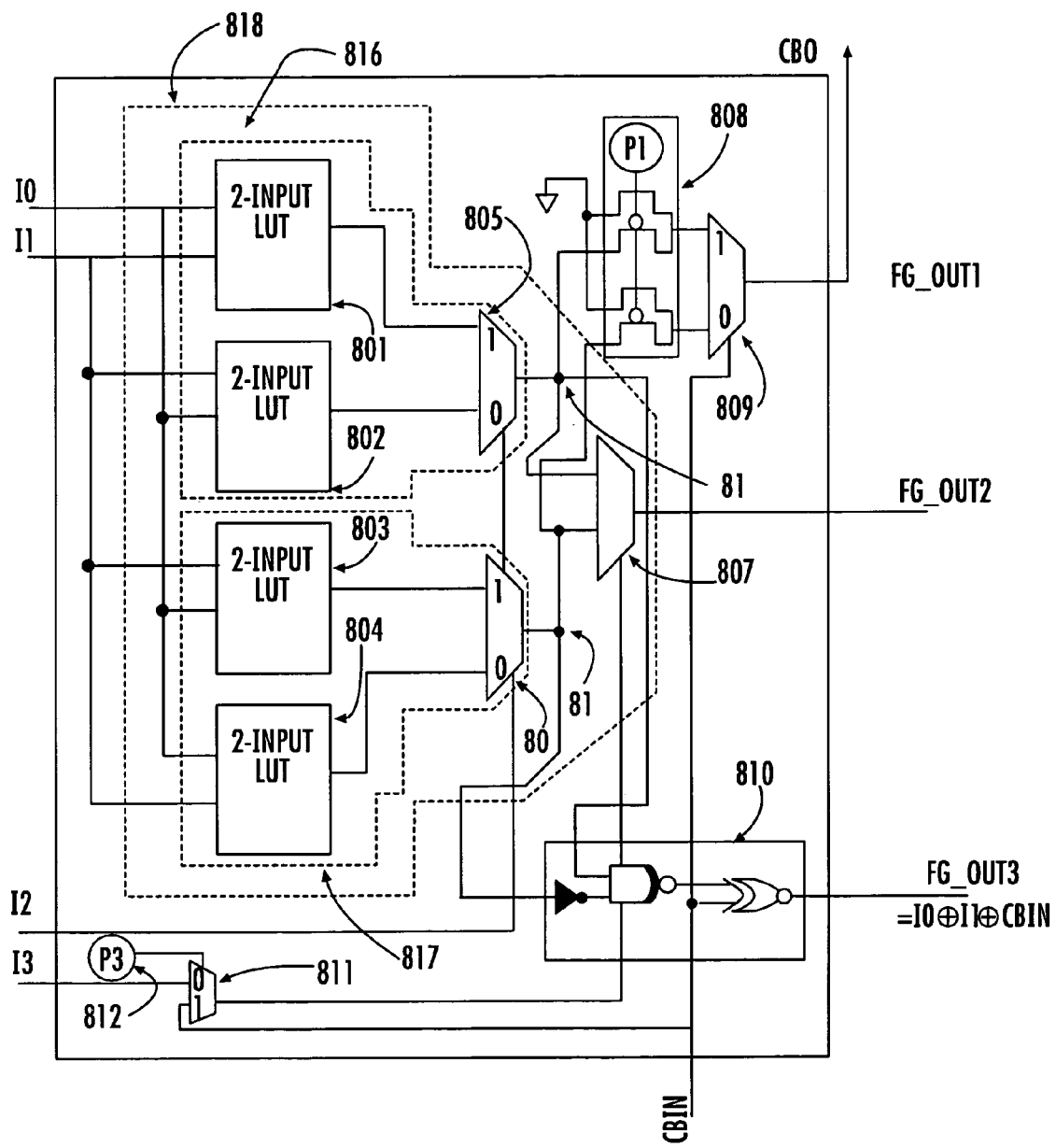

Considering FIG. 17, it is seen that it is identical to FIG. 8 except that the inputs to (810) are taken from points (814) and (815) instead of from the outputs of (801) and (803) as were taken in FIG. 8. If the structure shown in FIG. 17 has to implement the adder operation then the same functionality as shown in FIG. 10 can be implemented in FIG. 17 and the apparatus works similarly. Now suppose the structure shown in FIG. 17 has to implement the subtractor operation like that shown in FIG. 11 (for I0–I1) or FIG. 12 (for I1–I0). If the same functionality of FIG. 11 or FIG. 12 is implemented in FIG. 17 it can easily be verified by those skilled in the art that the DIFF function obtained at FG_OUT3 in FIG. 17 will actually be the inverted of that which is actually required and obtained at FG_OUT3 of FIG. 11 (for I0–I1) or FIG. 12 (for I1–I0).

Now since the DIFF function is actually a 3-input XOR function of operands "I0", "I1" and "CBin" therefore if any one of the inputs to this XOR function is inverted then we can obtain the non inverted value of the DIFF function in FIG. 17. This value will be correct and will match the functionality of FIG. 11 or FIG. 12. Here if it be chosen to invert CBin (which is Bin(direct) for the subtractor case) then we can obtain the desired functionality at the DIFF output of FIG. 17.

From Table 3 and Table 4 it is seen that for the same value of operands "A" and "B" if we choose Bin(2scomp) such that that Bin(2scomp)=~Bin(direct), we find that Bout (2scomp)=~Bout(direct). Thus inverting Bin(direct) is actually equivalent of passing Bin(2scomp). Therefore in a chain like that shown in FIG. 14 but with (1401), (1402) and (1403) replaced by structure of FIG. 17 and the chain implementing a subtractor operation, if at the LSB we invert CBin(Bin(direct)) then all subsequent Bouts will be inverted such that the DIFF output obtained is the correct value. This is equivalent of a 2scomplement subtraction operation in which we pass Bin(2somp) as equal to "1" at the LSB. However doing that would mean making unit (808) of the apparatus just below the LSB of the chain, generate both logic 0(for addition) or logic1 (for subtraction). This would be true for an apparatus like (1401) shown in FIG. 14, which would require its "Cbout" to be configured to logic 0 as well as logic 1. Additionally we would need the add-sub signal also to be routed to this place for implementing dynamic add-sub. This method would need two additional configuration bits.

However, another method exists which is shown in FIG. 16. This method involves the addition of Mux (1602) along with a single configuration bit (1601). Mux (1602) when configured to select the value at "0" input would pass the value of the 3-input LUT (816) through the NAND gate (1603) belonging to unit (810). This NAND gate now acts as a simple inverter since one of its input is at logic 1. Since CBin of the apparatus just below the apparatus from which the chain starts is configured to logic 0 as previously shown in FIG. 14, therefore the value of the 3-input LUT (816) is now available at FG_OUT3.

Thus at this point we can obtain any 3 input functions of inputs "I0", "I1" and "I2". This three input function can be the 2-input XOR of any of the 2-inputs belonging to "I0", "I1" or "I2". In such a case it becomes the sum/diff out of the half adder or the half subtractor. Further since "CBin" is pulled to logic 0 therefore the output of the other 3-input LUT (815) passes through Mux (809) and is available as "CBout" of the LSB operation. In case of an adder this can be the carry-out of the half adder while in case of the subtractor this can be the borrow-out of the half subtractor, which now will be the inversion of Bout (direct) i.e. it is now Bout (2scomp).

Since at the LSB operation we obtain inverted value of Bout (direct) which will act as the ~Bin (direct) of the next stage it follows from the previous discussions that Bout of this stage will also be ~Bout(direct) which will further act as the input of the next stage and so on. Thus at all subsequent stages we would obtain the inverted value of Bout(direct) Since we would obtain the inverted value of Bout(direct) at all stages this means we obtain the correct value of DIFF at all stages since as explained previously we would have obtained the inverted value of DIFF had we passed Bout (direct) without inverting using the implementation of FIG. 17.

When implementing dynamic add-sub operation any of the inputs "I0" or "I1" or "I2: can be used for the add-sub signal since the inputs to unit-808 are now the outputs of the 3-input LUT structures (816) and (817. This can be considered in contrast to FIG. 5 (Prior Art: Altera (Stratix device) data sheet) where the add-sub signal cannot be swapped with any other signal apart from "data1". Further more in the current invention any of the 3-inputs "I0", "I1" or "I2" can be used as the operands of the arithmetic operation, which can be considered in contrast to FIG. 4 (Prior Art: Reference Virtex II data sheet) where one of the operands has to be connected to either of inputs "G1" or "G2" or FIG. 5 (Prior Art: Altera(Stratix device) data sheet) where the operands can be placed only on "data1" or "data2".

Thus the invention provides three input logical equivalence between the operands of the arithmetic operation as well as between the operands and the add-sub signal. Increasing the logical equivalence makes it more software friendly since the solution space for the algorithms increase as now they can bring a particular signal to any of the inputs "I0", "I1" or "I2" for performing arithmetic operations. The three input logically equivalence can be exploited in a number of ways by those skilled in the art. One such use is the provision of carry insertion. Any of the 3 inputs "I0", "I1" or "I2" can be used for insertion of external carry. Further when implementing multipliers the intermediate product terms can be absorbed in the LUTs. Note that the 3-input LUT structures (816) and (817) shown in FIG. 16 can be implemented in number of ways; not limited to the implementation shown in FIG. 16.

This three-output, five input Function Generator can implement efficient dynamic as well as fixed addition and subtraction apart from implementing the normal 4-input LUT functions. Apart from that it allows cascading of 4-input LUTs which causes the implementation of very wide functions without any additional hardware and without any functional limitations caused due to some additional cascade element. The addition and subtraction operations are dependent only on the configuration bits of the LUT. No additional configuration bit differentiates between the subtraction and the addition operation. Further, three inputs of the LUT become logically equivalent for arithmetic performing operations i.e. not only the operands used in the arithmetic operations can be swapped with each other but also the operands and the add-sub signal.

That which is claimed is:

1. A configurable logic device comprising:
a first configurable logic subsystem to generate a logic OR output based upon N−1 input variables in an arithmetic mode;
a second configurable logic subsystem to generate a logic AND output based upon N−1 input variables in the arithmetic mode; and
a configurable logic block including inputs to receive an output of the first configurable logic subsystem, an output of the second configurable logic subsystem, an Nth input variable, and a carry/borrow signal;
the configurable logic block providing a first output corresponding to the carry/borrow signal in the arithmetic mode, a second output corresponding to logical functions of the N input variables in a logic mode and a third output corresponding to a sum/difference value in the arithmetic mode.

2. A configurable logic device as claimed in claim 1, wherein each of said first and second configurable logic subsystems comprises:
a pair of N−1 input Look Up Tables (LUTs) for generating a logic OR and logic AND output as a function of the N−1 input variables; and
a two input selector to receive an output of the pair of N−1 input look up tables for generating a signal corresponding to a logic OR or logic AND function of the N−1 input variables.

3. A configurable logic device as claimed in claim 2, wherein each of the N−1 Look Up Tables comprises a two-input Look Up Table.

4. A configurable logic device as claimed in claim 1, wherein said configurable logic block comprises:
a first switching unit to receive the Nth input variable, the carry/borrow signal and a configuration bit, for generating a control signal;
a first selection unit including a control input to receive the control signal from the first switching unit, and to receive the outputs of the first and second configurable logic subsystems, for generating an output corresponding to the logical function of N input variables, in the logic mode;
a third configurable logic subsystem to receive the outputs of the first and second configurable logic sub systems, to receive the carry/borrow signal and a configuration bit, for generating a signal corresponding to the carry/borrow signal in the arithmetic mode, and for, at least one of, performing a selection from the outputs of the first and second configurable logic sub systems based on the carry/borrow signal and generating a constant logic value, based upon the configuration bit;
a fourth configurable logic subsystem to receive the outputs of the first and second configurable logic sub systems, to receive the carry/borrow signal and the configuration bit, for generating an output corresponding to a sum/difference value in the arithmetic mode, and for, at least one of, passing a value of the first configurable logic subsystem to an output and performing an XNOR operation of the carry/borrow signal with a NANDing operation of the output of the first configurable logic sub system with the complement of the second configurable logic sub system, based upon the configuration bit.

5. A configurable logic device as claimed in claim 4, wherein said first selection unit comprises a two-input multiplexer.

6. A configurable logic device as claimed in claim 4, wherein said fourth configurable logic subsystem comprises:
a logic nand-gate including a first input to receive the output of one look up table of said pair of N−1 input look up tables of said first configurable logic subsystem, and a second input to receive an inverted output of one look up table of said pair of N−1 input look up tables of said second configurable logic subsystem; and
a logic xnor-gate including a first input to receive an output of said logic nand-gate and a second input to receive the carry/borrow signal.

7. A configurable logic device as claimed in claim 4, wherein said third configurable logic subsystem comprises at least one selector coupled to a plurality of pass transistors.

8. A cascaded configurable logic device comprising:

a plurality of cascade coupled configurable logic devices for generating at least a two-bit arithmetic mode output, each configurable logic device including
  a first configurable logic subsystem to generate a logic OR output based upon N−1 input variables in an arithmetic mode;
  a second configurable logic subsystem to generate a logic AND output based upon N−1 input variables in the arithmetic mode; and
  a configurable logic block including inputs to receive an output of the first configurable logic subsystem, an output of the second configurable logic subsystem, an Nth input variable, and a carry/borrow signal;
  the configurable logic block providing a first output corresponding to the carry/borrow signal in the arithmetic mode, a second output corresponding to logical functions of the N input variables in a logic mode and a third output corresponding to a sum/difference value in the arithmetic mode.

9. A cascaded configurable logic device as claimed in claim 8, wherein the carry/borrow signal of the first of said configurable logic devices is received from the carry/borrow signal output of the second of said configurable logic devices.

10. A method for providing an arithmetic operation comprising:
  generating a logical OR output by a first configurable logic subsystem based upon N−1 input variables in an arithmetic mode;
  generating a logical AND output by a second configurable logic subsystem based upon N−1 input variables in an arithmetic mode; and
  providing a configurable logic block with outputs of the first and second configurable logic subsystem, an Nth input variable and a carry/borrow signal to generate a first output corresponding to the carry/borrow signal in an arithmetic mode, a second output corresponding to logic functions of the N input variables in the logic mode, and a third output corresponding to a sum/difference value in the arithmetic mode.

11. A method as claimed in claim 10, wherein each of said first and second configurable logic subsystems comprises:
  a pair of N−1 input Look Up Tables (LUTs) for generating a logic OR and logic AND output as a function of the N−1 input variables; and
  a two input selector to receive an output of the pair of N−1 input look up tables for generating a signal corresponding to a logic OR or logic AND function of the N−1 input variables.

12. A method as claimed in claim 11, wherein each of the N−1 Look Up Tables comprises a two-input Look Up Table.

* * * * *

UNITED STATES PATENT AND TRADEMARK OFFICE
CERTIFICATE OF CORRECTION

PATENT NO. : 7,372,296 B2 Page 1 of 1
APPLICATION NO. : 11/263386
DATED : May 13, 2008
INVENTOR(S) : Vivek Kumar Sood It is certified that error appears in the above-identified patent and that said Letters Patent is hereby corrected as shown below:

On Sheet 12 of 17, in FIG. 12 (Adjacent to Reference Numeral 1009), line 1, Delete "I0 xnorI1" and insert -- I0 xnor I1 --, therefor.

In column 1, line 57, after "Table 2" insert -- . --.

In column 6, line 57, delete "I0,I1,I2" and insert -- I0, I1, I2 --, therefor.

In column 6, line 67, delete "Mux(806)" and insert -- Mux (806) --, therefor.

In column 7, line 2, delete "Mux(809)" and insert -- Mux (809) --, therefor.

In column 7, line 14, after "Mode" insert -- . --.

In column 7, line 35, after "Addition Mode" insert -- : --.

In column 9, line 19, delete "Mux(807)" and insert -- Mux (807) --, therefor.

In column 10, line 31, delete "logic 0(for" and insert -- logic 0 (for --, therefor.

In column 10, line 31, delete "logic1" and insert -- logic 1 --, therefor.

In column 11, line 9, delete "(817." and insert -- (817). --, therefor.

Signed and Sealed this

Thirtieth Day of September, 2008

JON W. DUDAS
*Director of the United States Patent and Trademark Office*